United States Patent
Ha et al.

(10) Patent No.: US 6,319,785 B1
(45) Date of Patent: Nov. 20, 2001

(54) METHOD FOR FORMING A CONTACT IN A SEMICONDUCTOR DEVICE

(75) Inventors: Dae-Won Ha, Seoul; Dong-Won Shin, Kyunggi-do, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/315,342

(22) Filed: May 20, 1999

(30) Foreign Application Priority Data

May 29, 1998 (KR) .................................................. 98-19866

(51) Int. Cl.[7] .......................... H01L 21/336; H01L 21/38
(52) U.S. Cl. ............................. 438/305; 438/558; 438/655
(58) Field of Search ................................... 438/558, 305, 438/683, 653, 655

(56) References Cited

U.S. PATENT DOCUMENTS

| | | | |
|---|---|---|---|
| 5,674,774 | * | 10/1997 | Pasch et al. |
| 5,801,086 | * | 9/1998 | Lee ....................................... 438/558 |
| 5,874,342 | * | 2/1999 | Tsai et al. ............................ 438/301 |
| 5,950,098 | * | 9/1999 | Oda et al. ............................ 438/527 |
| 6,004,871 | * | 12/1999 | Kittl et al. ........................... 438/592 |
| 6,048,794 | * | 4/2000 | Chen et al. .......................... 438/675 |
| 6,110,789 | * | 8/2000 | Rhodes et al. ....................... 438/305 |

* cited by examiner

Primary Examiner—Richard Booth
(74) Attorney, Agent, or Firm—Volentine Francos, PLLC

(57) ABSTRACT

A method for forming a contact is provides that can minimize junction leakage. In this method, A contact hole is opened in an insulating layer to expose an impurity diffusion layer in a semiconductor substrate. A silicide layer is then selectively formed on the bottom of the contact hole, i.e., over the impurity diffusion layer. Impurity ions are then implanted into the impurity diffusion layer through the silicide layer so as to reduce contact resistance. The remainder of the contact hole is then filled with metal. Because of the presence of the silicide layer, ion implanting damages is confined to within the suicide layer, and there is no damage to the underlying impurity diffusion layer. As a result, silicon substrate defects can be minimized and a reliable junction without junction leakage can be obtained.

10 Claims, 10 Drawing Sheets

METHOD FOR FORMING A CONTACT IN A SEMICONDUCTOR DEVICE

This application relies for priority upon Korean Patent Application No. 98-19866, filed on May 29, 1998, the contents of which are herein incorporated by reference in their entirety.

FIELD OF THE INVENTION

The present invention relates to a method for forming a contact plug in a semiconductor substrate, and more particularly to a method for forming a contact hole with a low contact resistance and a minimum junction leakage.

BACKGROUND OF THE INVENTION

A connection between a conductive region, e.g. an impurity diffusion layer in a semiconductor substrate or a lower level wiring layer, and an upper level wiring layer through a contact hole formed in an interlayer insulating film is an important technique in manufacturing semiconductor devices. Recently, the fabrication of extremely complex, high-density integrated circuits has been made possible through an advance in integrated circuit fabrication technology. This advance in integrated circuit fabrication technology has scaled devices down toward DRAMs in the gigabit range, which have feature sizes of less than 0.15 $\mu$m. In the case of a memory device with an integration density as high as in the gigabits, contact holes inevitably require a high aspect ratio, i.e., a smaller area compared to their depth.

As the aspect ratio of a contact hole increases, however, so too does its contact resistance. To reduce the contact resistance, an ion implanting process is often carried out on the bottom of the contact hole following the formation of the contact hole.

This conventional method for forming a contact is depicted in FIGS. 1A to 1C, which illustrate the process flow in a cross-sectional view. Referring to FIG. 1A, a device isolation layer 12 is formed over a p-type semiconductor substrate 10. An N$^+$ type impurity diffusion layer 14 is then formed in the p-type semiconductor substrate 10, and an interlayer dielectric layer 16 is formed over the semiconductor substrate 10. A contact hole 18 is then opened in the interlayer dielectric layer 16 to expose a portion of the impurity diffusion layer 14.

Referring to FIG. 1B, in order to improve the contact resistance of this contact hole, impurity ions are implanted into the exposed impurity diffusion layer 14. As is well known, this ions implantation is provided to serve the dual purpose of preventing p-n junction leakage and suppressing any increase in contact resistance. Such an increase in contact resistance may result from substrate damage and the consumption of the impurity diffusion layer caused by over-etching due to contact hole misalignment.

Referring to FIG. 1C, a refractory metal layer 20 is deposited in the contact hole and over the interlayer dielectric layer 16. A portion of refractory metal layer 20 that contacts the exposed substrate 10 and impurity diffusion layer 14 is then transformed into a silicide layer 22 by an annealing process. A barrier metal layer 24 is then deposited in the contact hole and over the refractory metal layer 20. Finally, the remainder of the contact hole is filled with a wiring metal 26, which is patterned, along with the refractory metal layer 20 and the barrier metal layer 24 to form a multilayer metal plug.

The annealing is carried out to out-diffuse implanted impurity ions from the impurity diffusion layer 14 into the silicide layer 22 and the portion of the semiconductor substrate 10 initially in contact with the refractory metal layer 20.

It is noted that the ion implantation is carried out with a high dose of more than $1\times10^{15}$ cm$^{-2}$ under an implantation angle that is substantially a right angle with respect to the substrate, i.e., with a tilt of about 0°, because of the high aspect ratio of the contact holes. As a result, the actual impurity concentration depth profile is significantly different from a desired concentration depth profile.

FIG. 2 shows an impurity concentration profile in the silicon substrate after impurity ions are implanted according to this conventional method for forming a contact. As seen in FIG. 2, the actual impurity concentration depth profile 2 has a deep tail portion beyond the critical depth as compared a to desired concentration depth profile 1. This makes if difficult to form a shallow junction and consequently aggravates the short channel effect and increases the channelling effect. Furthermore, substrate damage caused by contact over-etching and point defects caused by ion implanting can cause a silicon dislocation loop at the depletion region of the p-n junction region. An example of such a silicon dislocation loop "A" is depicted in FIG. 3A, which is a vertical XTEM (X-transmission electron microscopy) micrograph. FIG. 3B is a planar SEM (scanning electron microscopy) of a semiconductor substrate having a defect "B" near the edge portion of an interfacing region between an active region and a device isolation region.

In reverse bias, the presence of a silicon dislocation significantly increases the leakage current of the p-n junction by a magnitude of about 10$^6$, as compared to a normal junction leakage. This increase in the leakage current results in an unacceptable increase in the standby current of the device.

SUMMARY OF THE INVENTION

The present invention was made in view of the above problem, and it is therefore an object of the invention to provide a method for forming a contact that can minimize implanting damage during an ion implanting process.

It is another object of the invention to provide a method for forming a contact that can minimize junction leakage.

A key feature of the invention is implanting impurity ions into a contact hole following the formation of a silicide on an impurity diffusion layer, i.e., on bottom of the contact hole. This suicide layer serves to block the implanting damage as well as to reduce contact resistance. Any implanting damage is confined within the silicide layer and the implanted impurities out-diffuse into the underlying impurity diffusion layer during subsequent annealing process.

The above and other objects in accordance with the present invention may be realized by forming an impurity diffusion layer in a semiconductor substrate, and then forming an insulating layer over the impurity diffusion layer. The semiconductor substrate preferably has an opposite conductivity type with respect to the impurity diffusion layer. For example, if the semiconductor substrate is p-type, the impurity diffusion layer is n-type.

A contact hole is then opened in the insulating layer to expose the impurity diffusion layer, preferably by a dry etching process. A refractory metal layer such as cobalt or titanium is deposited in the contact hole and over the insulating layer. The portion of the refractory metal layer contacting the impurity diffusion layer is transformed into a silicide layer by annealing. The silicide formation results from reaction between refractory metal and silicon of the substrate. Impurity ions of the same conductivity type as the diffusion layer are then implanted into resulting structure.

The implanting energy is preferably controlled such that the implanting damages are confined within the silicide layer or refractory metal layer. A barrier metal layer such as a titanium nitride layer is deposited in the contact hole and over the refractory metal layer. Finally, the remainder of the contact hole is filled with a wiring metal such as tungsten, aluminum, or copper. Annealing is then performed to out-diffuse the implanted impurities from the silicide layer into the diffusion layer, specifically increasing impurities concentration at the interface between the silicide layer and the diffusion layer.

According to another aspect of the present invention, if the silicide layer is formed to have a thickness greater than 50 nm, the un-reacted refractory metal can be removed, and then impurity ions can be implanted.

According to another aspect of the present invention, the implantation of impurity ions can be carried out following formation of the barrier layer in the contact hole.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

Preferred embodiments of the present invention will now be described with reference to the accompanying drawings. The present invention relates to a method for forming a contact in a semiconductor substrate.

Figure 1A:
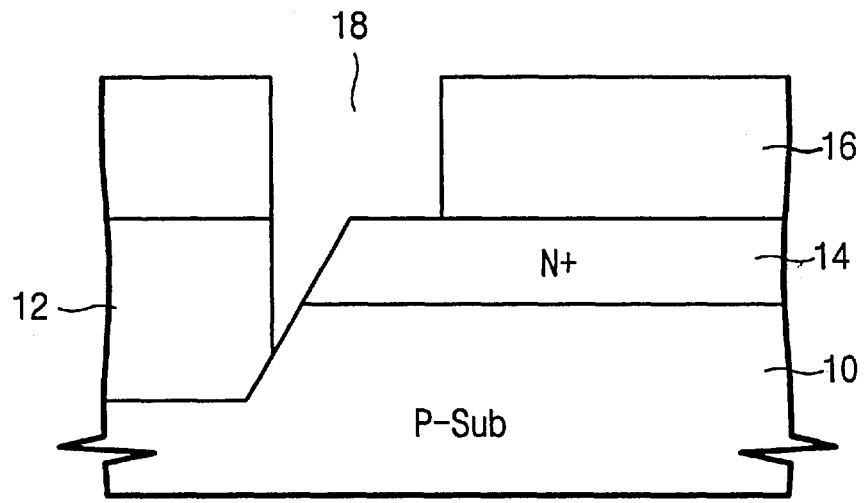
FIGS. 1A to 1C illustrate in a cross-sectional view the process flow of forming a contact according to a conventional method.
Figure 1B:
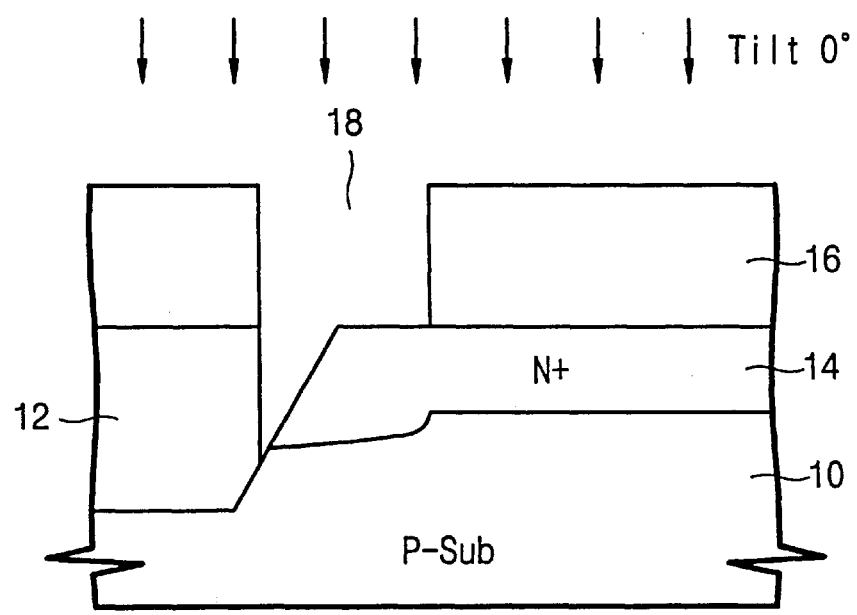
Figure 1C:
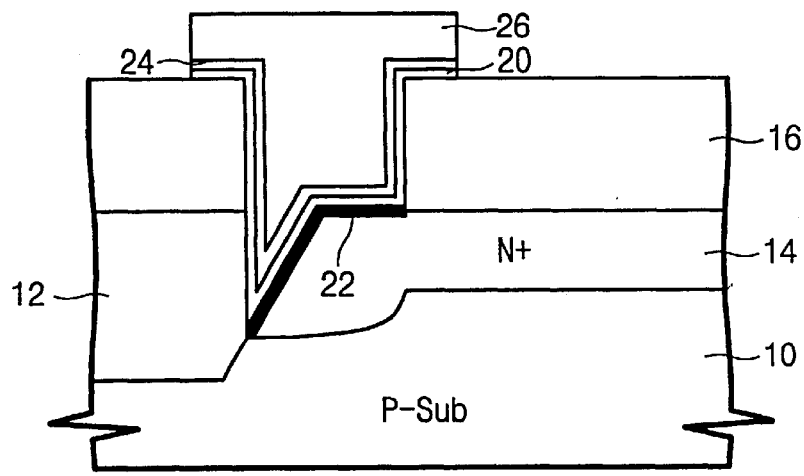
Figure 2:
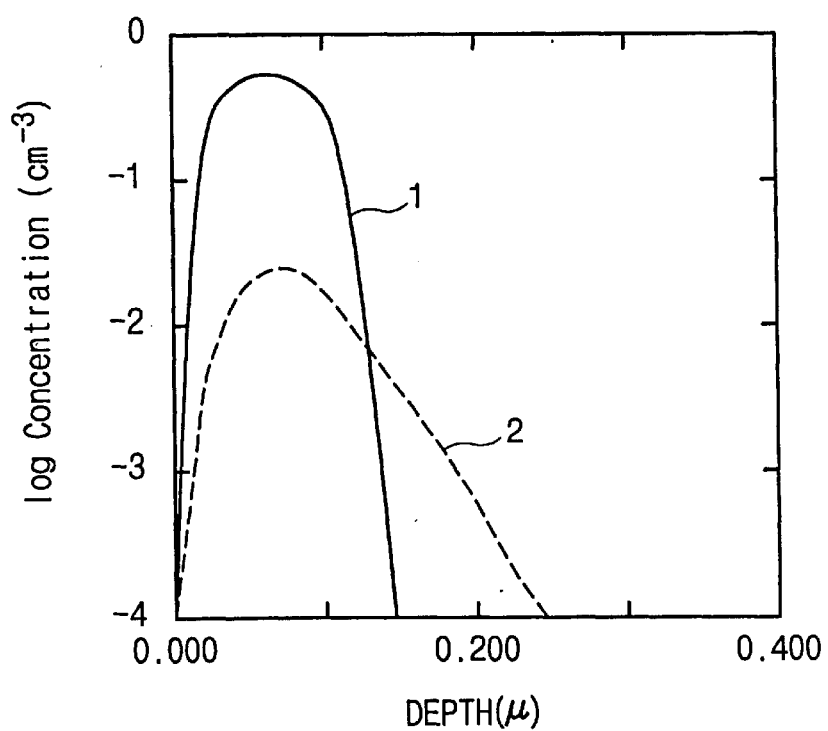
FIG. 2 shows an actual and a desired impurity concentration profile in a silicon substrate after impurity ions are implanted according to a conventional method for forming a contact.
Figure 3A:
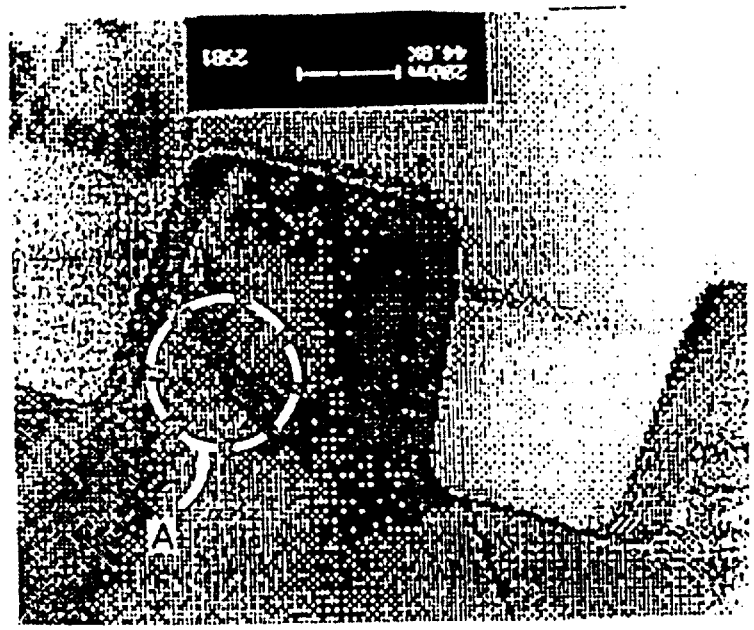
FIGS. 3A and 3B are XTEM and SEM micrographs of silicon substrate, respectively, after impurity ions are implanted according to a conventional method for forming a contact.
Figure 3B:
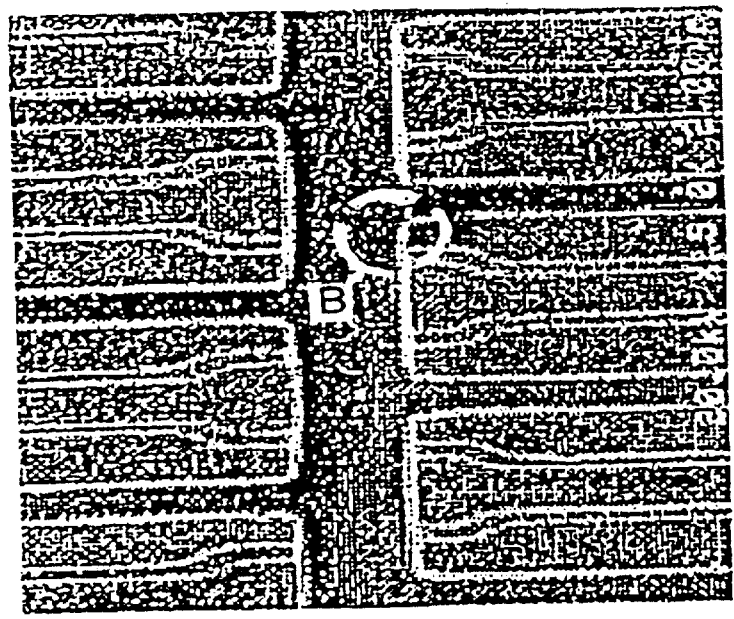
Figure 4A:
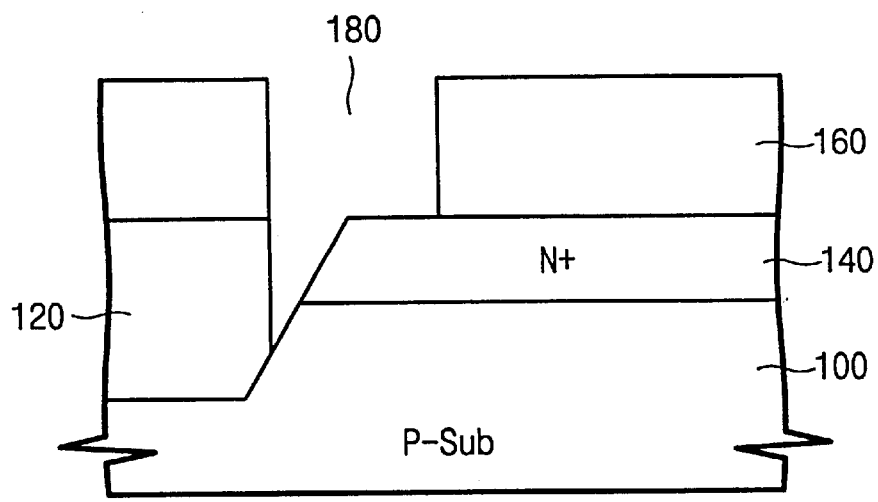
FIGS. 4A to 4D illustrate in a cross-sectional view the process flow of forming a contact according to a first preferred embodiment of the present invention.

FIG. 4A–4D show a first preferred embodiment of the present invention. Referring now to FIG. 4A, a cross-sectional view is schematically shown of a semiconductor substrate 100 with a contact hole 180 built in an insulating layer 160 over the semiconductor substrate 100.

As shown in FIG. 4A, a semiconductor substrate 100 is provided. Preferably, the semiconductor substrate comprises a p-type single crystal silicon, although, in the alternative, an n-type substrate can be used. A device isolation layer 120 is formed over a predetermined region of the semiconductor substrate 100 to defined active and inactive regions. Impurity ions are then implanted into the active region of the semiconductor substrate 100 to form an impurity diffusion layer 140.

The conductivity type of the impurity diffusion layer 140 is determined based on the type of the substrate used. In the preferred embodiment, $n^+$-type impurity ions are implanted to form the impurity diffusion layer, since the substrate is p-type. If, however, the substrate were n-type, the impurity ions would $p^+$-type.

An insulating layer is formed over the substrate 100, including the impurity diffusion layer, and the device isolation layer 120. The insulating layer 160 is preferably a nitride layer or an oxide layer. A contact hole 180 is then opened in the insulating layer 160, preferably by dry etching using photolithography, to expose the substrate 100, including a portion of the impurity diffusion layer 140.

Figure 4B:
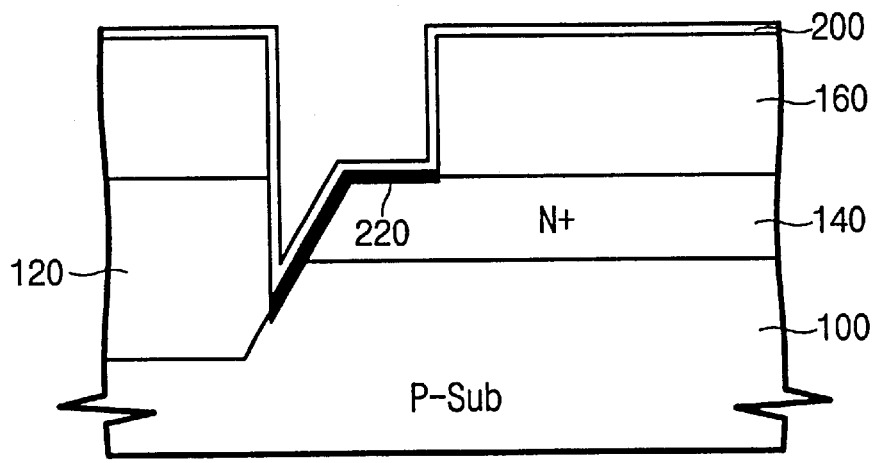

Referring to FIG. 4B, a refractory metal 200 is then deposited in the contact hole 180 and over the insulating layer 160. The refractory metal 200 preferably includes titanium (Ti) or cobalt (Co). In order to form a silicide layer 220, a rapid thermal annealing is then carried out. During this annealing, the refractory metal 200 reacts with the silicon in the exposed substrate 100 and in the impurity diffusion layer 140 exposed by the contact hole 180. Thus, the silicide layer 220 is only formed on the bottom of the contact hole opposing the substrate 100, including a portion of the diffusion layer 140. The silicide layer 220 is preferably $TiSi_2$ or $CoSi_2$ and the thickness of the silicide layer 220 is determined by the annealing conditions and thickness of the refractory metal layer 200.

Figure 4C:
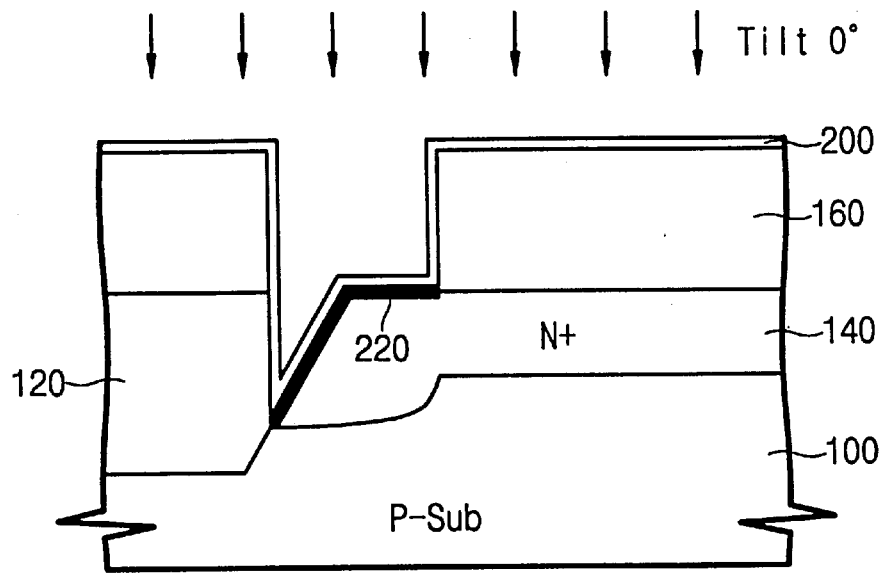

Referring to FIG. 4C, if the silicide layer 220 is formed to have a thickness less than 50 nm, impurities are implanted into the contact hole 180 at a substantially right angle to the contact hole, without removing the refractory metal layer 200. The presence of the silicide layer 220 and refractory metal layer 200 having a polycrystalline structure reduces the channelling effect in the single crystalline p-type substrate 100. Such a reduced channelling effect allows for an easier formation of a shallow junction and an improved short channel effect. The impurity implanting energy is carefully controlled such that implanting damage such as point defects are confined within the silicide layer 220 and the refractory metal layer 200, which thereby prevents silicon dislocation in the depletion region of the p-n junction.

Figure 4D:
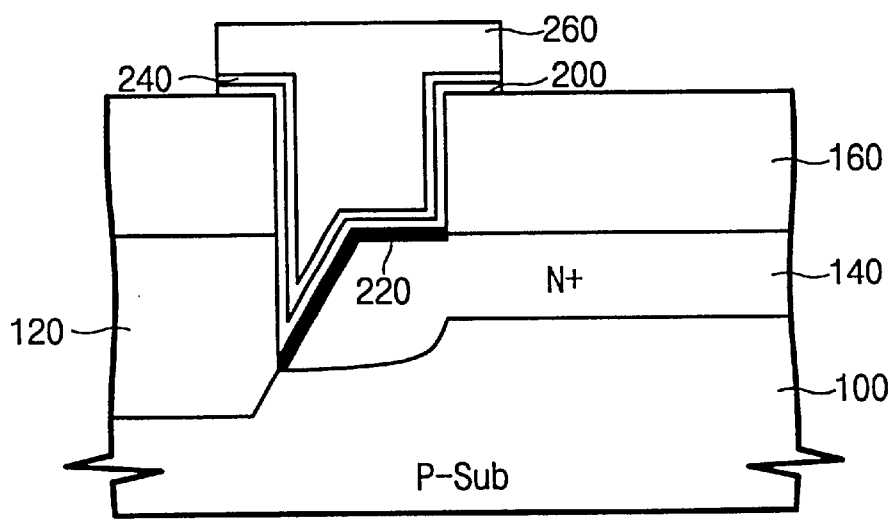

Referring to FIG. 4D, a barrier layer 240 is then deposited in the contact hole 180 and over the refractory metal layer 200. The preferred barrier layer 240 is a titanium nitride layer. This barrier layer 240 prevents the reaction between the silicide layer and a the wiring metal 260, which preferably comprises tungsten, aluminium, copper, or the like. The wiring metal 260, the barrier metal 240 and the refractory metal 200 are then patterned to form a wiring metal plug as shown in FIG. 4D.

Subsequently annealing is carried out to out-diffuse implanted impurities from the silicide layer 220 into the diffusion layer 140, and thereby increase the impurity concentration in the diffusion layer 140, specifically increasing the impurity concentration at the interface between the silicide layer 220 and the diffusion layer 140. These diffused impurities act to reduce the contact resistance.

A second preferred embodiment of the present invention will now be described with reference to FIGS. 5A to 5D. The same parts function as shown in FIGS. 4A to 4D, and are identified with the same reference numbers and their explanation are omitted. The significant difference from the first embodiment is that the thickness of the silicide layer 220 in the second preferred embodiment is thicker than that of the first preferred embodiment. In second preferred embodiment, the suicide layer 220 is formed to have a thickness above 50 nm.

Figure 5A:
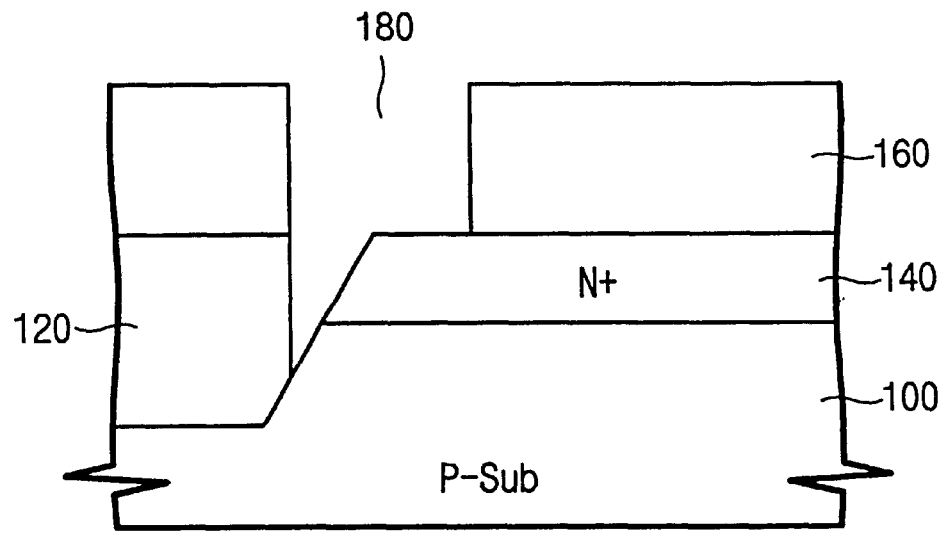
FIGS. 5A to 5D illustrate in a cross-sectional view the process flow of forming a contact according to a second preferred embodiment of the present invention.
Figure 5B:
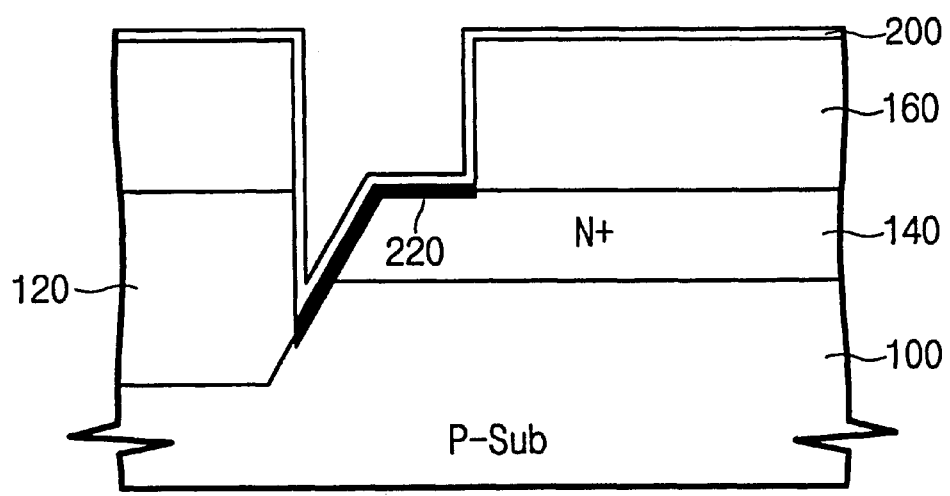

Referring to FIGS. 5A to 5B, after the formation of a device isolation layer 120, an impurity diffusion layer 140, and an insulting layer 160, a contact hole 180 is formed in the insulating layer 160. The refractory metal 200 is deposited in the contact hole 180 and over the insulating layer 160. Rapid thermal annealing is then carried out to form the silicide layer 220 on the diffusion layer 140 and the exposed substrate 100.

Figure 5C:
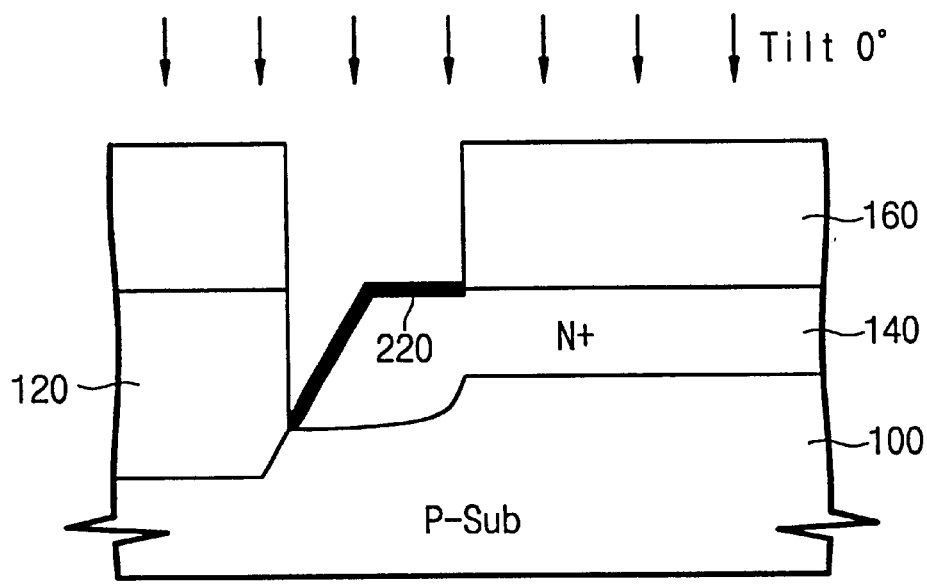
Figure 5D:
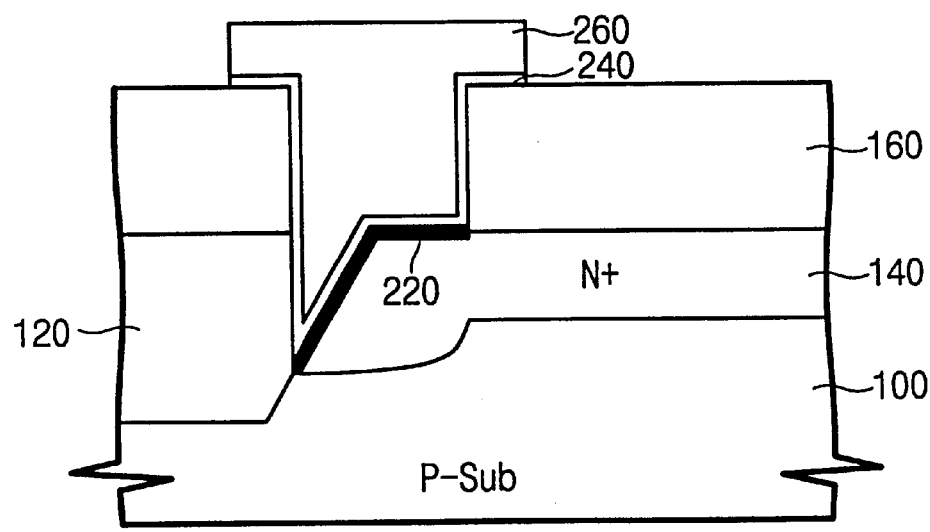

Referring to FIG. 5C, since the thickness of the silicide layer is above 50 nm it is sufficiently thick to block implanting damage on its own. As a result, the refractory metal 200 can be removed prior to ion implantation. Impurities are then implanted into the contact hole 180 as in the first preferred embodiment. The subsequent processing sequence is also same as in the first preferred embodiment.

A third preferred embodiment of the present invention will now be described with reference to FIGS. 6A to 6E. The same parts function as shown in FIGS. 4A to 4D, and are identified with the same reference numbers and their explanation are omitted. The significant difference from the first embodiment is that impurity implantation is carried out following the formation of the barrier layer 240 in the contact hole 180.

Figure 6A:
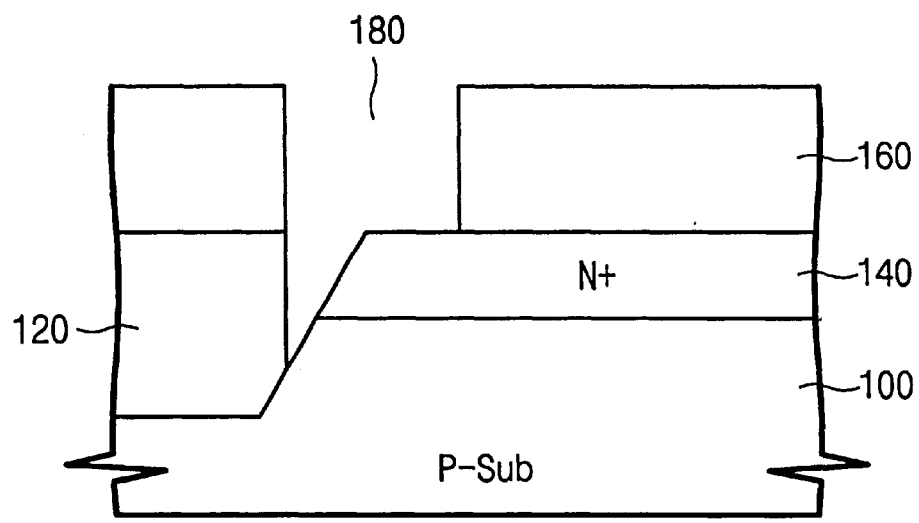
FIGS. 6A to 6E illustrate in a cross-sectional view the process flow of forming a contact according to a third preferred embodiment of the present invention.
Figure 6B:
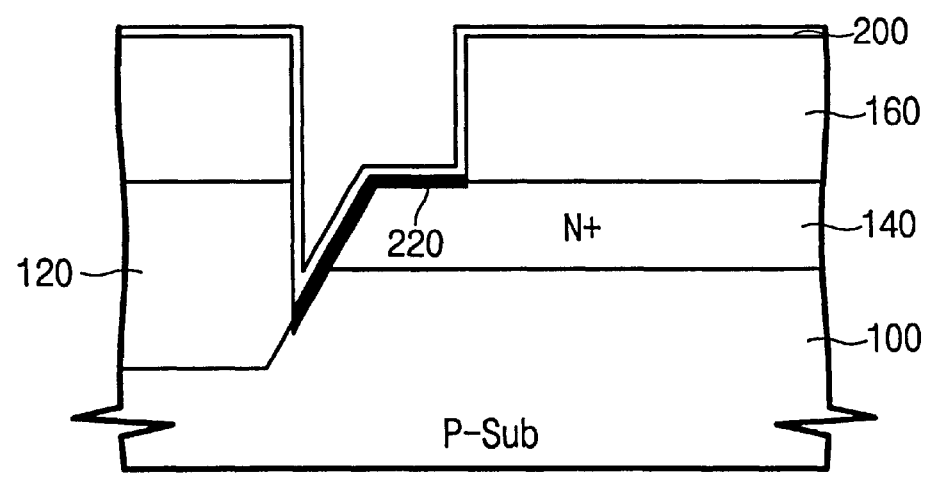
Figure 6C:
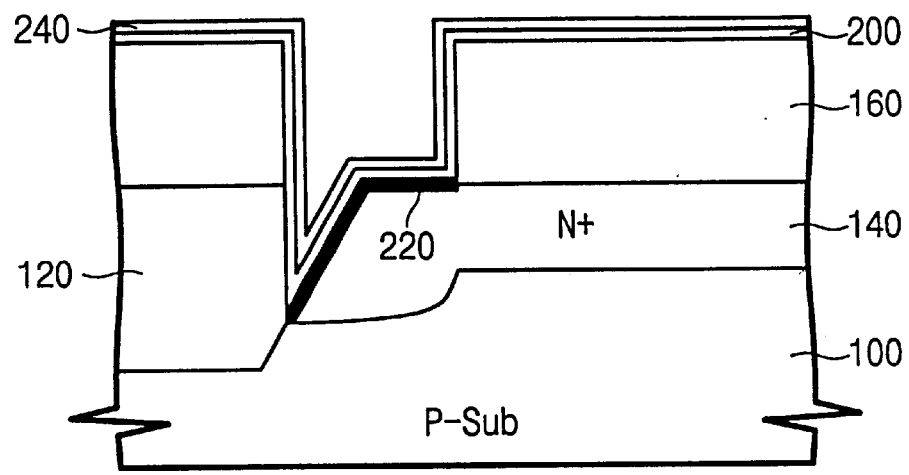

Referring to FIGS. 6A to 6C, after the formation of a device isolation layer 120, an impurity diffusion layer 140, and an insulting layer 160, a contact hole 180 is formed in the insulating layer 160. A refractory metal 200 is deposited in the contact hole 180 and over the insulating layer 160. Rapid thermal annealing is then carried out to form a silicide layer 220 on the diffusion layer 140 and the exposed substrate 100. After forming the silicide layer 220, a barrier layer 240 is deposited in the contact hole 180 and over the refractory metal layer 200.

Figure 6D:
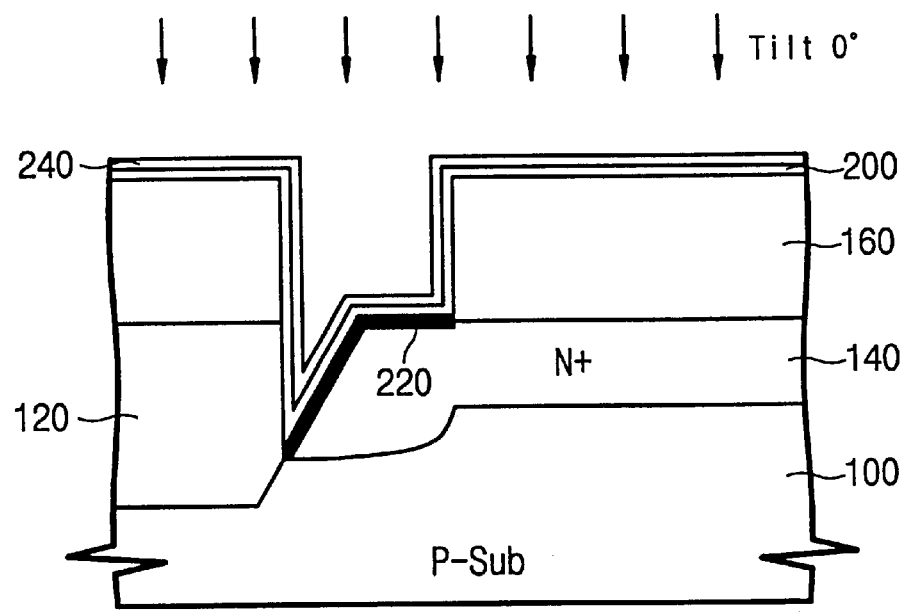

With reference to FIG. 6D, after forming the barrier layer 240, impurities are then implanted as described in the first preferred embodiment, using the barrier layer 240, the refractory metal layer 200, and the silicide layer 220 to block implanting damage.

Figure 6E:
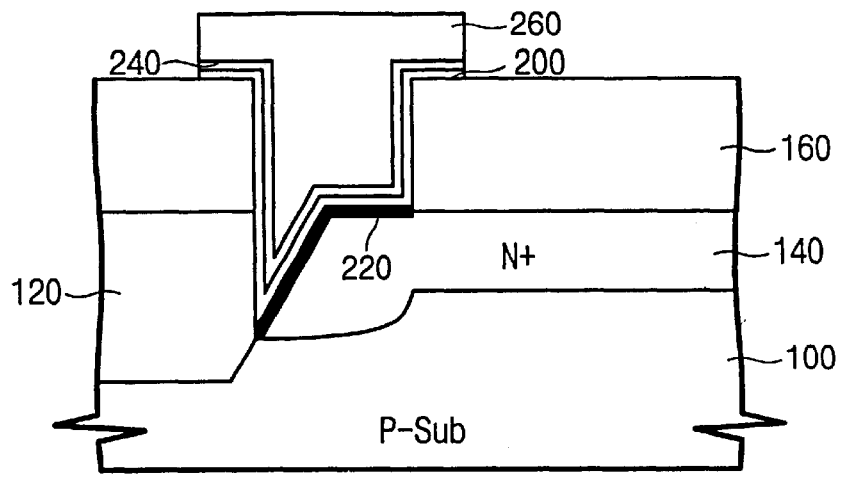

With reference to FIG. 6E, a wiring metal 260 is then deposited to fill the remainder of the contact hole 180. Subsequent processing is then the same as in the first preferred embodiment.

In accordance with the present invention, substrate damage such as point defects and extended silicon dislocation at the depletion region of the p-n junction can be prevented by the presence of an implanting-damage barrier layer, i.e., suicide layer. Such a silicide layer can also improve contact resistance.

Figure 7:
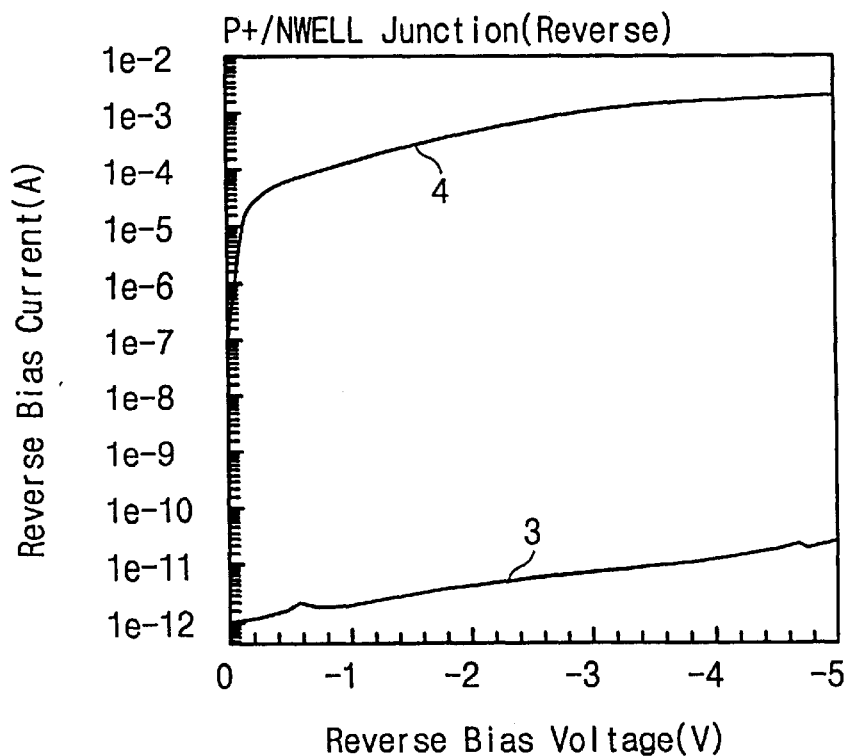
FIG. 7 illustrates the I-V characteristics of a p-n junction according to both a conventional method containing a dislocation loop and preferred embodiments of the present invention without a dislocation loop for reverse bias.

FIG. 7 illustrates the I-V characteristics of p-n junctions of both a conventional method containing a dislocation loop (line 3), and of preferred embodiments of the present invention without a dislocation loop for reverse bias (line 4). As can be seen by line 3, the presence of silicon dislocation significantly increases the leakage current of the p-n junction by a factor of more than $10^6$, as compared to the present invention, which eliminates the dislocation loop.

While this invention has been particularly shown and described with reference to preferred embodiments thereof, it will be understood by those skilled in the art that various changes in form and details may be made without departing from the spirit and scope of this invention.

What is claimed is:

1. A method for forming a contact in a semiconductor device, comprising:

forming an impurity diffusion layer in a semiconductor substrate;

forming an insulating layer over the impurity diffusion layer;

forming a contact hole in the insulating layer to expose a portion of the impurity diffusion layer;

forming a silicide layer in the contact hole to contact the impurity diffusion layer;

implanting impurities into the silicide layer;

depositing a conductive layer to fill the contact hole; and patterning the conductive layer.

2. A method for forming a contact in a semiconductor device, as recited in claim 1, wherein the forming of the suicide layer comprises:

depositing a refractory metal in the contact hole and over the insulating layer; and annealing the semiconductor substrate to transform a portion of the refractory metal layer contacting the impurity diffusion layer into the silicide layer, wherein the implanting of impurities is carried out under such energy conditions as to confine implanted point defects within the suicide layer or the refractory metal layer.

3. A method for forming a contact in a semiconductor device, as recited in claim 2, further comprising, removing the remainder of the refractory metal after annealing the semiconductor substrate.

4. A method for forming a contact in a semiconductor device, as recited in claim 2, wherein the refractory metal comprises titanium or cobalt.

5. A method for forming a contact in a semiconductor device, as recited in claim 1, wherein depositing the conductive layer comprises:

depositing a reaction barrier metal layer in the contact hole and over the insulating layer; and depositing a conductive metal layer over the reaction barrier metal layer to fill the contact hole.

6. A method for forming a contact in a semiconductor device, as recited in claim 5, wherein the conductive metal layer comprises tungsten or aluminum.

7. A method for forming a contact in a semiconductor device, as recited in claim 1, further comprising forming a reaction barrier metal layer before implanting the impurities, and wherein the conductive layer comprises a conductive metal layer.

8. A method for forming a contact in a semiconductor device, as recited in claim 1, wherein the suicide layer is 50 nm or less in thickness.

9. A method for forming a contact in a semiconductor device, as recited in claim 1, further comprising performing an annealing process, after patterning the conductive layer, to out-diffuse the impurities from the silicide layer into the impurity diffusion layer.

10. A method for forming a contact in a semiconductor device, as recited in claim 1, wherein the silicide layer comprises $TiSi_2$ or $CoSi_2$.

* * * * *